United States Patent
Chen et al.

(10) Patent No.: US 8,951,625 B2
(45) Date of Patent: Feb. 10, 2015

(54) OPTICAL MICROSTRUCTURE FILM AND METHOD FOR FABRICATING THE SAME

(75) Inventors: Hsin-Yuan Chen, Ping-Zhen (TW); Yu-Yun Hsieh, Ping-Zhen (TW); Cheng-Lun Liao, Ping-Zhen (TW)

(73) Assignee: Entire Technology Co., Ltd. (TW)

(*) Notice: Subject to any disclaimer, the term of this patent is extended or adjusted under 35 U.S.C. 154(b) by 606 days.

(21) Appl. No.: 13/312,808

(22) Filed: Dec. 6, 2011

(65) Prior Publication Data

US 2013/0029080 A1    Jan. 31, 2013

(30) Foreign Application Priority Data

Jul. 25, 2011    (TW) ............................. 100126164 A

(51) Int. Cl.

| | |
|---|---|
| B32B 3/00 | (2006.01) |
| B32B 3/14 | (2006.01) |
| B32B 37/00 | (2006.01) |
| B32B 37/06 | (2006.01) |
| B32B 37/10 | (2006.01) |
| G02B 1/00 | (2006.01) |
| G02B 3/00 | (2006.01) |
| G02B 5/02 | (2006.01) |
| G02B 5/04 | (2006.01) |
| F21V 8/00 | (2006.01) |
| H01L 31/048 | (2014.01) |
| H01L 31/052 | (2014.01) |

(52) U.S. Cl.
CPC ................. *B32B 3/14* (2013.01); *B32B 37/003* (2013.01); *B32B 37/06* (2013.01); *B32B 37/10* (2013.01); *G02B 1/00* (2013.01); *G02B 3/005* (2013.01); *G02B 5/0215* (2013.01); *G02B 5/045* (2013.01); *G02B 6/0028* (2013.01); *H01L 31/0481* (2013.01); *H01L 31/0488* (2013.01); *H01L 31/0522* (2013.01); *B32B 2457/12* (2013.01); *Y02E 10/52* (2013.01)
USPC ........................................... 428/174; 428/156

(58) Field of Classification Search
CPC ................................... B32B 3/00; B32B 3/30
USPC ......................................... 428/156, 172, 174
See application file for complete search history.

(56) References Cited

U.S. PATENT DOCUMENTS

2009/0169820 A1* 7/2009 Koike et al. .................... 428/156

* cited by examiner

*Primary Examiner* — Catherine A Simone

(57) ABSTRACT

An optical microstructure film includes a base and multiple microstructure units. The base has at least a surface. The microstructure units are disposed in an array manner on the surface of the base. Each microstructure unit is formed to be a polygonal cone having the bottom face is attached to the surface of the base. The concave region is a surface part of a pseudo-spherical structure having a lower point on the microstructure unit. The distance from the lower point to the bottom face is defined as a second height, the sum of a radius of the spherical structure and the second height is defined as a first height, and the ratio of the second height to the first height is ranged from 0.1 to 0.8.

13 Claims, 12 Drawing Sheets

OPTICAL MICROSTRUCTURE FILM AND METHOD FOR FABRICATING THE SAME

BACKGROUND OF INVENTION

1. Field of the Invention

The invention is related to an optical microstructure film and a method for fabricating the optical microstructure film, and more particularly to the optical microstructure film applicable to solar cells. The optical microstructure film introduces special microstructures to reduce the formation of gas inside the solar cell so as to improve the yield in mold stripping during the manufacturing of the solar cells.

2. Description of the Prior Art

Referring to FIG. 1, it is shown that an optical film of a conventional solar cell is located tightly between a glass substrate 70 and a back plate 80. During a packaging process in the art, air bubbles or gas voids 90 are opt to be formed between the optical film and the glass substrate 70. Following disadvantages would prevail while meeting the gas voids 90.

1. Possible moisture inside the gas voids 90 on the optical film would lead possible shortcut in electrical elements so as to reduce the photo-electron conversion efficiency.

2. The existence of the gas voids 90 would sponge the optical film and thus reduce its capability in shock-absorbing and anti-impact. As a result, the solar cell is vulnerable to breaks or damages while meeting foreign forcing.

3. Severe delamination would occur among the front panel, the solar cell and the back plate.

To improve the aforesaid shortcomings, some manufacturers are devoted to redesigning the surface structure of the optical film made of the ethylene-vinyl acetate copolymer (EVA). Referring to FIG. 1, protruding microstructures 91 and 92 are formed on the EVA optical film. Gas formed during the packaging process can be expelled out via the ventilation channels provided by the microstructures 90 and 91 during the laminating process of the glass substrate or the solar chip. However, if ventilation channels can't be formed between the microstructures 91 while the gluing resin is in a melted state, the result in gas-expelling would be far from being acceptable. Further, the microstructures 91 can also lead to poor mold delamination upon the EVA optical film and a reduced yield of the EVA optical film 91. Therefore, in order to ensure the yield in mold delamination, a tradeoff in reducing the manufacturing mass scale and increasing the reeling action is inevitable. Thereupon, the production is reduced and a follow-up thermal shrinking problem in the EVA optical film would be met.

In U.S. Pat. No. 7,851,694, an optical film for the conventional solar cells provides a microstructure formed by a plurality of micro protrusions with substantial spacing. However, in this disclosure, the problem in the disappearance of the ventilation channels during the melted state of the gluing material is yet to be resolved.

SUMMARY OF THE INVENTION

Accordingly, it is an object of the present invention to provide an optical microstructure film having plural microstructure units for solar cell modules and a manufacturing method for the solar cell modules having the optical microstructure films so as to overcome the aforesaid shortcomings in the conventional design as described above.

In the present invention, the optical microstructure film made of a thermoplastic material can comprise:

a base, having at least a surface; and a plurality of microstructure units, formed on the surface of the base in an array manner, each of the microstructure units further including a polygonal bottom to sit firmly on the surface of the base, each of the microstructure units also being formed as a polygonal cone having a top concave region, the polygonal cone having a removed tip for spherically centering the concave region, a radius R being defined as the radius of a pseudo sphere S having the surface of the concave region, a lower point of the microstructure unit being defined to the lowest point of the concave region, a distance between the lower point to the polygonal bottom being defined as a second height H2, a first height H1 being defined (H2) as a sum of the H2 and the R, a ratio of H2/H1 being ranged between 0.1 and 0.8.

In one embodiment of the present invention, the microstructure unit is formed as a tetragonal cone having two first contact points and two second contact points, located to opposite sides of the concave region.

In one embodiment of the present invention, the microstructure unit is formed as a triangular cone having a first contact point, a second contact point and a third contact point, located separately to sides of the concave region.

In one embodiment of the present invention, a volume Vp of the concave region is 0.05 to 0.4 of a volume of the pseudo sphere.

In one embodiment of the present invention, the microstructure unit further includes a third height H3 being ranged 0.2 to 0.9 of the difference (H1-H2).

In one embodiment of the present invention, the concave region is a curve polygonal surface.

In one embodiment of the present invention, a percentage of a volume Vp of the concave region to a volume Vt of the microstructure unit is defined as a porosity and is ranged between 36% and 80%.

In one embodiment of the present invention, the polygonal cone defines a length L for a lateral side thereof measured from the removal tip to the polygonal bottom, and a ratio of the radius R to the length L is ranged between 0.5 and 10.

In the present invention, the manufacturing method for a solar cell module having at least an optical microstructure film can include the steps of:

Providing a front protection plate, at least one optical microstructure film, a solar chip and a back protection plate; wherein the optical microstructure film further includes a base having at least a surface and a plurality of microstructure units formed on the surface of the base in an array manner, each of the microstructure units further including a polygonal bottom to sit firmly on the surface of the base, each of the microstructure units also being formed as a polygonal cone having a top concave region, the polygonal cone having a removed tip for spherically centering the concave region, a radius R being defined as the radius of a pseudo sphere having the surface of the concave region, a lower point of the microstructure unit being defined to the lowest point of the concave region, a distance between the lower point to the polygonal bottom being defined as a second height H2, a first height H1 being defined (H2) as a sum of the H2 and the R, a ratio of H2/H1 being ranged between 0.1 and 0.8;

Adhering in order the front protection plate, the optical microstructure film, the solar chip and the back protection plate so as to form an integral solar cell laminated unit;

Placing the solar cell laminated unit onto a heating plate;

Using the heating plate to heat the solar cell laminated unit; and

Applying a predetermined atmosphere pressure onto the solar cell laminated unit and keeping heating by the heating plate till a finished solar cell module having the optical microstructure film is formed.

Preferably, the optical microstructure film is made of an Ethylene-vinyl acetate copolymer (EVA).

Accordingly, the optical microstructure film of the present invention can be applied to packaging processes upon various objects. By providing the surface microstructure units 11, 11a and 11b to the film, the moisture inside the package can be greatly reduced, the demodeling in the production can be much easy, and the production yield can be substantially increased. In the preferred embodiments described above on the solar cell modules, the introducing of the optical microstructure film with the microstructure units can provide excellent gas-expelling efficiency, ensure the yield, and thus lower the production cost. Also, the design and the usage of the optical microstructure film can be applied to various fields, not limited to the solar cell industry. Therefore, the future and the real market value of the present invention shall be tremendous.

All these objects are achieved by the optical microstructure film described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to an optical microstructure film. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
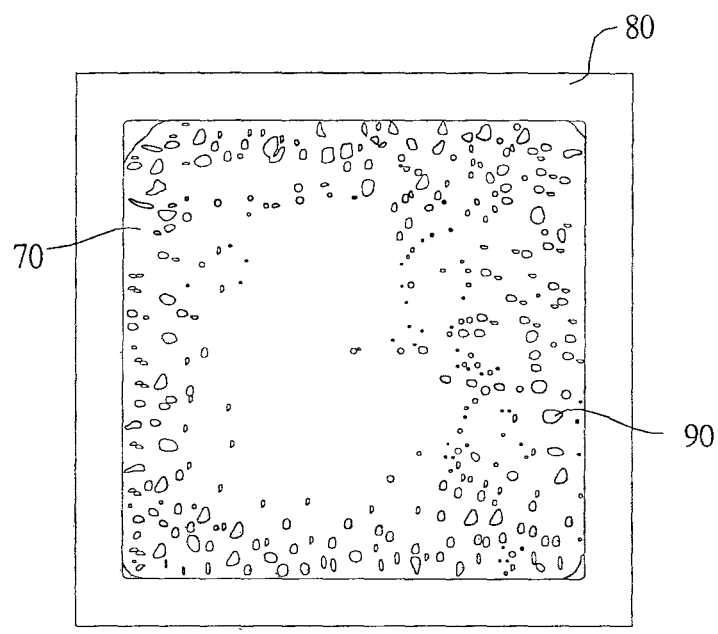
FIG. 1 is a schematic top view of a conventional solar cell laminating a glass substrate, an optical film and a back plate.
Figure 2:
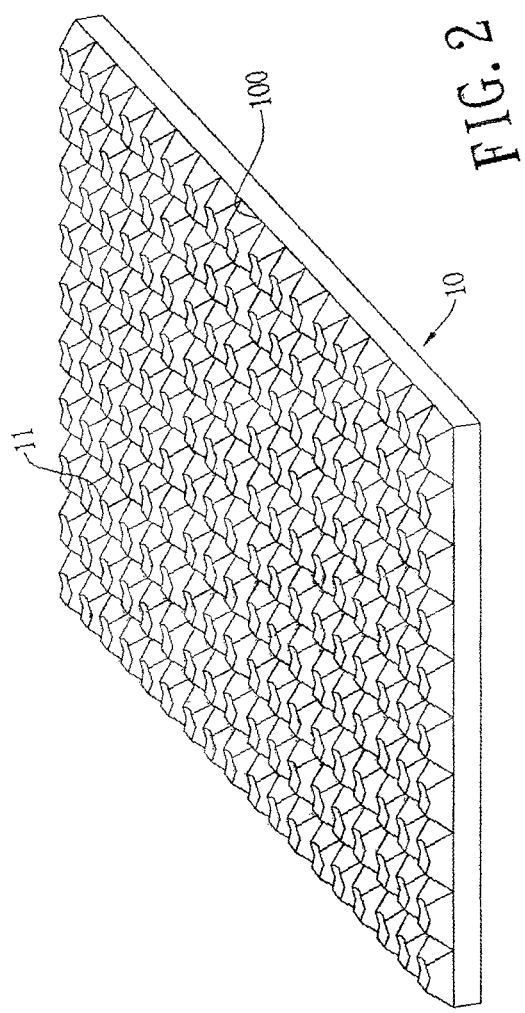
FIG. 2 is a perspective view of a preferred embodiment of an optical microstructure film in accordance with the present invention.

Referring now to FIG. 2, an optical microstructure film in accordance with the present invention made of a thermoplastic polymer is perspective shown. The thermoplastic polymer can be an EVA. The optical microstructure film can include a base 10 and a plurality of microstructure units 11. The base 10 has at least a surface 100. Preferably, the plurality of the microstructure units 11 is formed on the surface 100 of the base 10 in an array manner. Each of the microstructure units 11 further includes a polygonal bottom to sit firmly on the surface 100 of the base 10.

Figure 3:
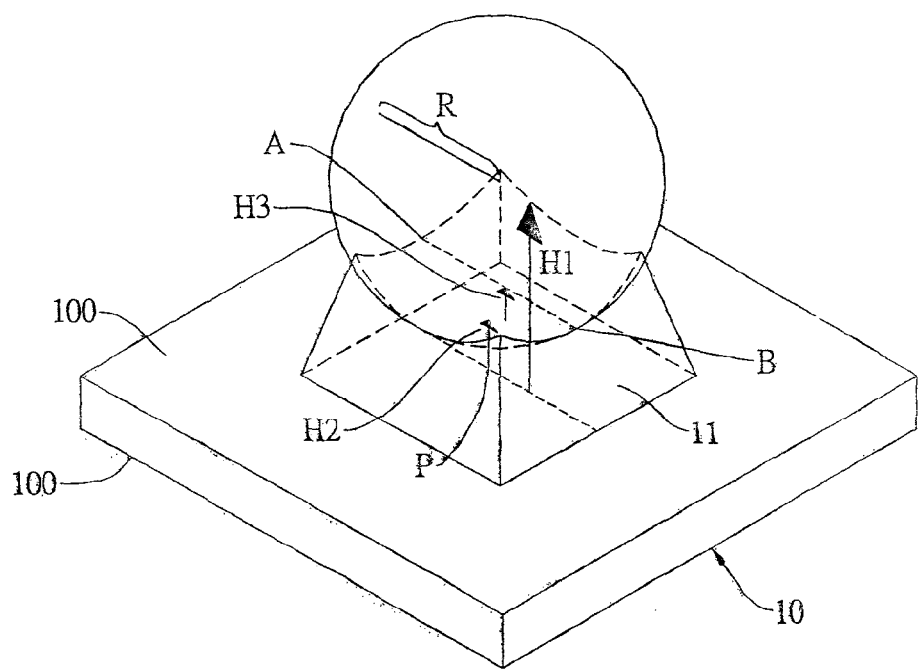
FIG. 3 is a perspective view in general of a unique microstructure unit of the optical microstructure film in accordance with the present invention.
Figure 4:
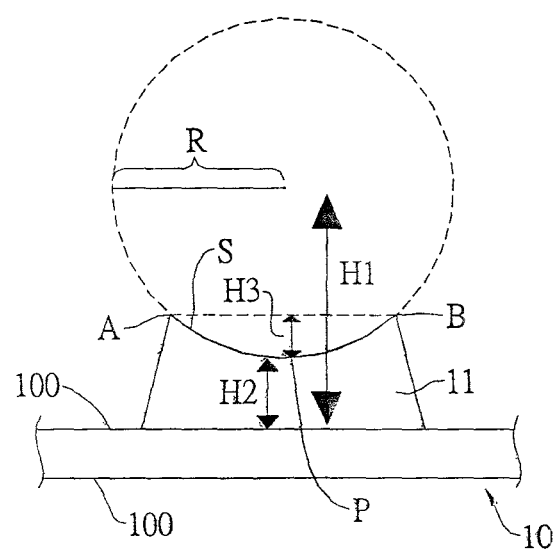
FIG. 4 is a side view of FIG. 3.
Figure 5:
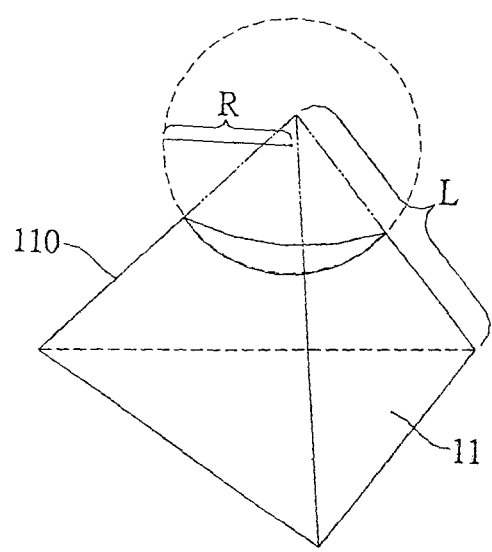
FIG. 5 is a perspective view of an embodiment of the microstructure unit of FIG. 3.

Referring now to FIG. 3 and FIG. 4, each of the microstructure unit 11 in accordance with the present invention is formed as a polygonal cone having a top concave region. The polygonal cone has a removed tip for spherically centering the concave region. A radius R is defined as the radius of a pseudo sphere S having the surface of the concave region. Referring further now to FIG. 5, the polygonal cone defines a length L for the lateral side thereof measured from the removal tip to the polygonal bottom. The ratio of the radius R to the length L is ranged between 0.5 and 10. A lower point P of the microstructure unit is defined to the lowest point of the concave region. The distance between the lower point P to the polygonal bottom is defined as a second height H2, and a first height H1 is defined (H2) to the sum of H2 and R. The ratio of H2/H1 is ranged between 0.1 and 0.8. In addition, the volume Vp of the concave region is 0.05 to 0.4 of the volume of the pseudo sphere. The microstructure unit 11 further includes at least a first contact point A and a second contact point B, located to the opposite sides of the concave region having the lower point P.

The microstructure unit 11 further includes a third height H3, 0.2 to 0.9 of the difference (H1-H2). Preferably, the H3 is 0.25 to 0.8 of the difference (H1-H2), and more preferably 0.3 to 0.7 of the difference (H1-H2). Further, the porosity, defined as the percentage of the volume Vp of the concave region to the volume Vt of the microstructure unit 11, is ranged between 36% and 80%.

Figure 6:
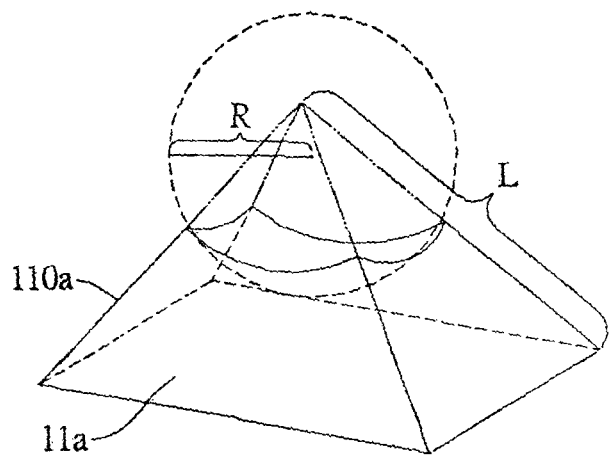
FIG. 6 is a perspective view of another embodiment of the microstructure unit of FIG. 3.
Figure 7:
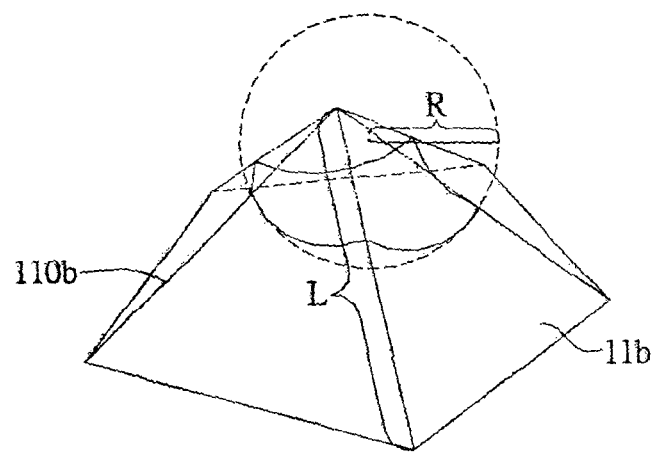
FIG. 7 is a perspective view of one more embodiment of the microstructure unit of FIG. 3.

Referring to FIG. 5 through FIG. 7, the polygonal bottom for either of the microstructure unit 11, 11a or 11b may have individual number n of the lateral sides. The n can be equal to 3, 4 or 5, and preferably 4. As shown, the shape of the polygonal bottom can be a triangle (FIG. 5), a tetragon (FIG. 6), a pentagon (FIG. 7) or any the like.

Figure 8:
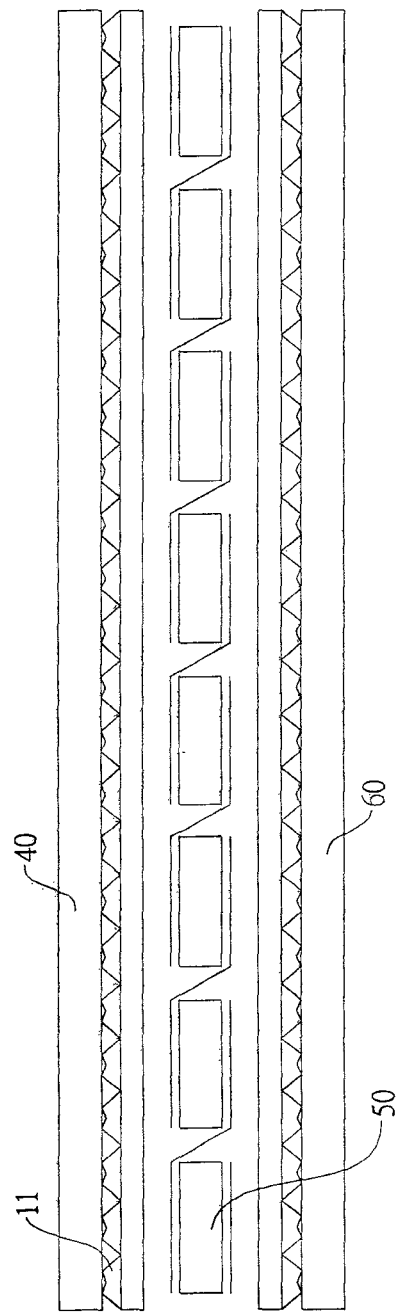
FIG. 8 is a side view of an aspect of the optical microstructure film between the front panel and the back plate in accordance with the present invention.
Figure 9:
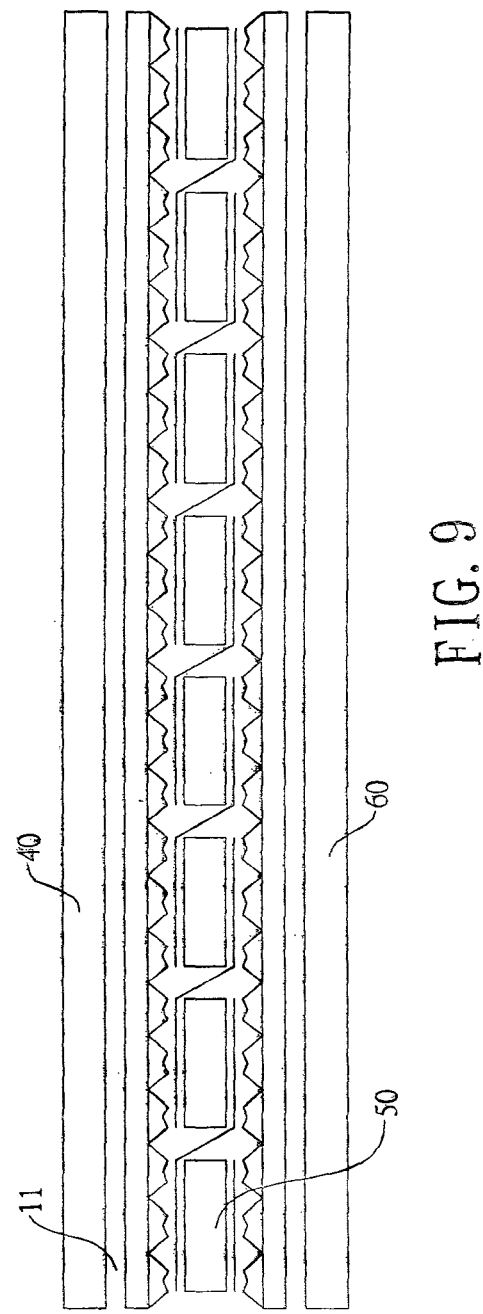
FIG. 9 is a side view of another aspect of the optical microstructure film between the front panel and the back plate in accordance with the present invention.
Figure 10:
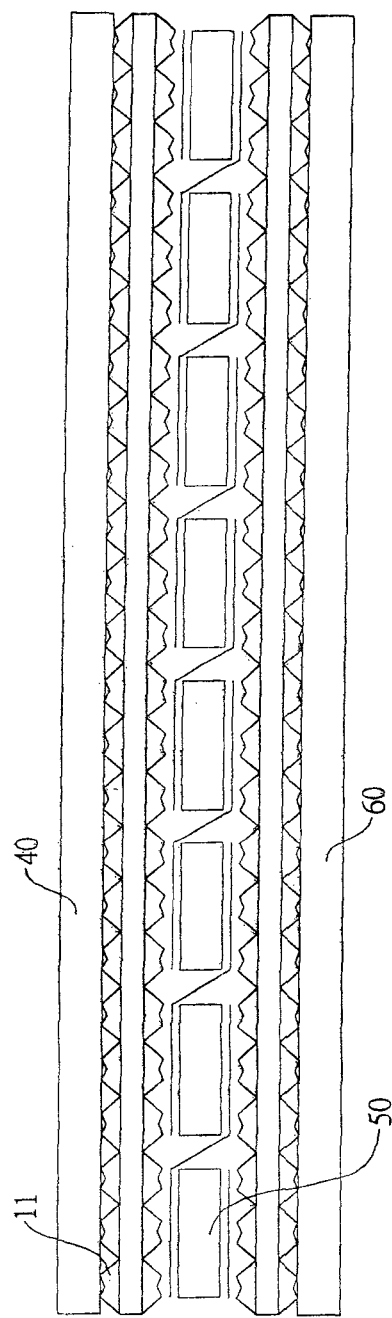
FIG. 10 is a side view of one more aspect of the optical microstructure film between the front panel and the back plate in accordance with the present invention.

Referring now to FIG. 8 through FIG. 10, a manufacturing method for the solar cell module having the optical microstructure film of the present invention can have the following steps of:

(a) Providing a front protection plate 40, at least one aforesaid optical microstructure film, a solar chip 50 and a back protection plate 60;

(b) Adhering in order the front protection plate 40, the optical microstructure film, the solar chip 50 and the back protection plate 60 so as to form an integral solar cell laminated unit;

(c) Placing the solar cell laminated unit onto a heating plate;

(d) Using the heating plate to heat the solar cell laminated unit; and (e) Applying a predetermined atmosphere pressure onto the solar cell laminated unit and keeping heating by the heating plate till a finished solar cell module having the optical microstructure film is formed.

As shown in FIG. 8 and FIG. 9, the individual microstructure unit 11 is located onto one surface of the base at a place between the front protection plate 40 and the base, or a place between the solar chip 50 and the base. Referring to FIG. 10, the microstructure units 11 are distributed to the opposing sides of the base; i.e. the surface of the base facing the front protection plate 40 and the surface thereof facing the solar chip 50.

Figure 11:
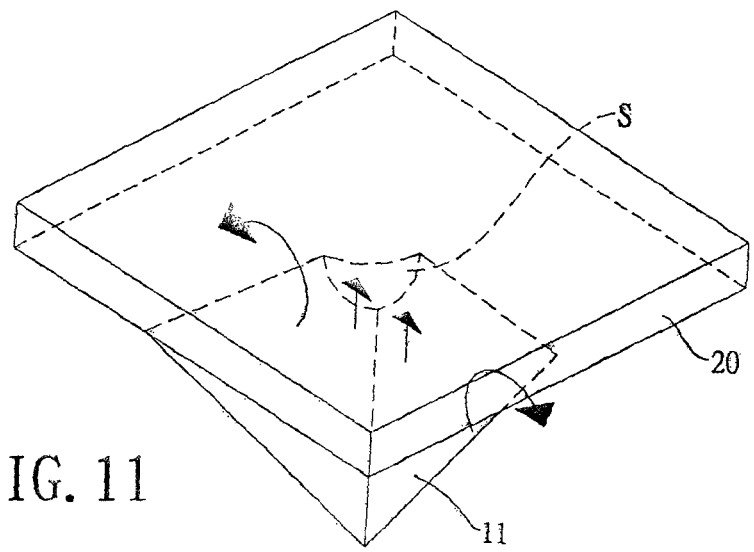
FIG. 11 is a perspective view of an aspect of an embodiment of the microstructure unit of the optical microstructure film in accordance with the present invention.
Figure 12:
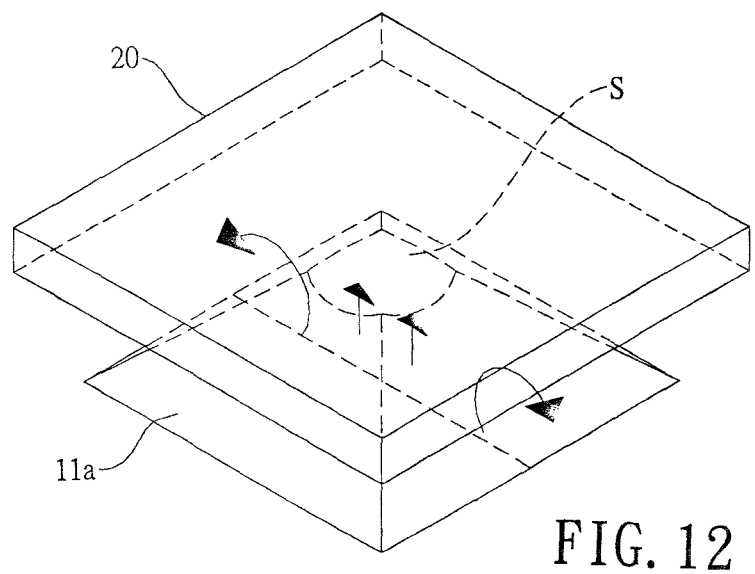
FIG. 12 is a perspective view of another aspect of an embodiment of the microstructure unit of the optical microstructure film in accordance with the present invention.
Figure 13:
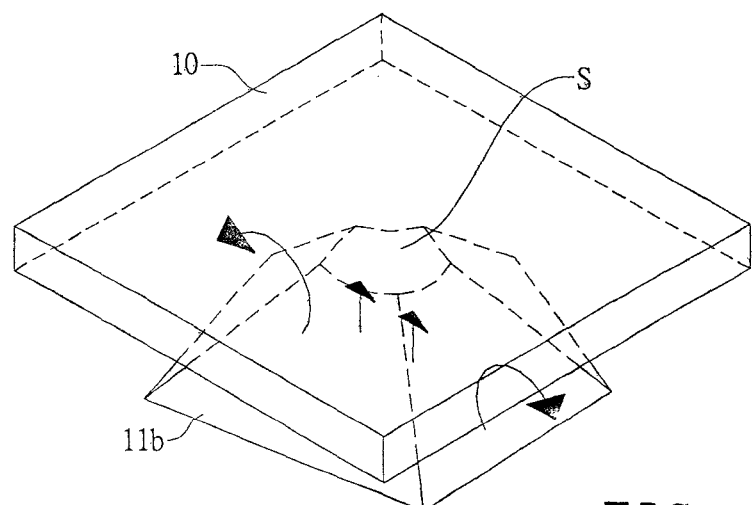
FIG. 13 is a perspective view of one more aspect of an embodiment of the microstructure unit of the optical microstructure film in accordance with the present invention.
Figure 14:
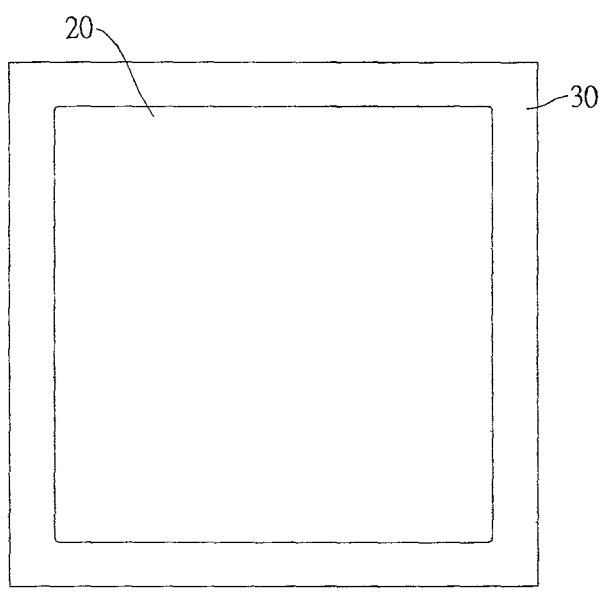
FIG. 14 is a schematic top view of a solar cell laminating a glass substrate, an optical microstructure film of the present invention and a back plate.

Referring now to FIG. 11 through FIG. 13, a vacuum laminating machine can be used to laminate the optical microstructure film and the solar chips 50. While in laminating, moisture inside the microstructure units 11 can be driven to leave the space between the solar chips 50 and the optical microstructure film via the spacing among the microstructure units 11, 11a and 11b and the spacing provided by the concave regions of the microstructure units 11, 11a and 11b. In particular, the concave regions on tops of the microstructure units 11, 11a and 11b provide continuous spacing channels connecting the spacing among the microstructure units 11, 11a and 11b to the top area of the optical microstructure film so as to successfully expel the moisture between the optical microstructure film and the solar chips 50 or the front protection plate 40 during the laminating process. Upon such an arrangement, the efficiency in expelling the moisture during the laminating process can be substantially increased. Referring now to FIG. 14, by applying the aforesaid manufacturing method and the optical microstructure film in accordance with the present invention, the three-layer laminator including the glass substrate 20, the optical microstructure film and the TPT film 30 is shown to have no interior air bubbles or gas voids.

In the present invention, the front protection plate 40 and the back protection plate 60 of the solar cell module produced by the aforesaid manufacturing method can be both the glass substrates. Preferably, the laminated unit of the solar cell can have two optical microstructure films of the present invention to sandwich the solar chips 50. In particular, the microstructure units 11 of every optical microstructure film are arranged to face the solar chips 50. Further, while in the laminating and heating process, the predetermined atmosphere pressure is introduced to gradually expel the interior moisture to flow outwards and leave the compressing space between the optical microstructure film and the solar chips 50.

Following are examples to show testing results upon the optical microstructure film of the present invention in the peeling strength and the gas-expelling efficiency.

Example 1

Testing for peeling strength of the EVA optical microstructure film in accordance with the present invention A. Preparation of the film 1. Prepare a glass substrate by washing thoroughly with an isopropanol (IPA) solution and wiping off with a kimwipe;

2. Place the glass substrate on a release paper by flushing the glass substrate with the release paper at the respective lateral sides;

3. Cut a 1"×12" piece of the EVA optical microstructure film of the present invention and place the piece of the film on the glass substrate;

4. Sandwich a piece of release paper between the glass substrate and the optical microstructure film, with the release paper extending ½" (i.e. a half) into the spacing in between;

5. Prepare a 1"×12" piece of TPT and place the TPT onto the EVA film to form a combination;

6. Place a release paper to completely cover the combination;

7. Heat to package the combination in accordance with a comprehensive testing spec; for example, to heat the combination for 10 minutes under 150° C.;

8. Complete the packaging of the combination while the heating is over, and cool the combination to a room temperature;

9. Arrange the combination on a cut board with the glass substrate facing downward and the TPT piece facing upward;

10. Mark three points at the rim of the combination by a ruler and a pen to separate adjacent points by ½" and by having the first point located at a bottom side of the combination;

11. Cut the combination into two ½"-width slender pieces from a top side to the bottom side thereof with a knife, and also cut off the extra film material hanging over the glass substrate; and 12. Apply respective forcing to each top of the slender piece to peel the optical microstructure film from the glass substrate till a substantial predetermined resistance against the peeling is sensed, and then use a knife to cut off the peel-off portion of the film from the glass substrate.

B. Testing for the peeling strength of the slender piece

1. Arrange and clamp tightly the slender piece onto a tension tester;

2. Adopt a standard tension test to the slender piece, preferably with a 200 mm/min pulling rate, to record the width changes of the slender piece;

3. Analyze the tensile strength after the testing; and 4. after all the testing, calculate by averaging the tensile peeling force (F) and the adhesion strength, in which the adhesion strength is the ratio of the tensile peeling force (F) to the width (W) of the slender piece.

Example 2

Testing for gas-expelling efficiency of the EVA optical microstructure film in accordance with the present invention A. Preparation of the test specimen 1. Sandwich a 10 cm×10 cm optical microstructure film between a 10 cm×10 cm front plate and a 10 cm×10 cm back plate, in which the front plate is a glass plate;

2. Use a vacuum laminating machine to adhere the front plate, the optical microstructure film and the back plate, under 150° C. for vacuuming 5-10 minutes, and then introduce an atmosphere pressure for 10-15 minutes to ensure the adhering and to obtain a specimen; and 3. Compute (A2/A1)×100% and the gas-expelling efficiency 1−(A2/A1)×100%, in which A1 is the total area of the specimen and A2 is the total area for the air bubbles on the specimen.

Example 3

Testing Results of the Peeling Strength and the Gas-Expelling Efficiency of the EVA Optical Microstructure Film in Accordance with the Present Invention Referring to Table 1, Table 2 and Table 3, testing data for the films with different microstructure units 11, 11a and 11b are shown. In these tables, data for the gas-expelling efficiency, the peeling strength, the structural moduling ratio, the production yield (also the whole-span moduling ratio) and the machine number for production are included.

TABLE 1

Testing and Analysis results for the optical microstructure film with triangular-cone microstructure units (n = 3)

| Speciment | Porosity (%) | H2/H1 | H3/(H1 − H2) | Gas-expelling rate(mm3/sec) | Gas-expelling efficiency (%) | Peeling strength (N/cm) | Structural moduling ratio | Yield | Machine number |
|---|---|---|---|---|---|---|---|---|---|
| Micostructure | 10 | 0.8 | 0.9 | 200 | 88 | 90 | ⊙ | ⊙ | ⊙ |
| units: | 20 | 0.7 | 0.8 | 400 | 92 | 96 | ⊙ | ⊙ | ⊙ |
| triangilar | 30 | 0.6 | 0.7 | 600 | 95 | 102 | ⊙ | ⊙ | ⊙ |
| cone | 36 | 0.5 | 0.6 | 720 | 100 | 116 | ⊙ | ⊙ | ⊙ |
| (n = 3) | 40 | 0.45 | 0.55 | 800 | 98 | 104 | ⊙ | ⊙ | ⊙ |
|  | 50 | 0.4 | 0.5 | 1000 | 99 | 108 | ⊙ | ⊙ | ⊙ |
|  | 60 | 0.3 | 0.4 | 1200 | 96 | 103 | ⊙ | ⊙ | ⊙ |
|  | 70 | 0.2 | 0.3 | 1400 | 91 | 92 | Δ | Δ | Δ |
|  | 80 | 0.1 | 0.2 | 1600 | 90 | 91 | Δ | Δ | Δ |

Note:
⊙: 90% and up;
○: 80~90%;
Δ: 70~80%;
X: 70% and down

TABLE 2

Testing and Analysis results for the optical microstructure film with tetragonal-cone microstructure units (n = 4)

| Speciment | Porosity (%) | H2/H1 | H3/(H1 − H2) | Gas-expelling rate (mm3/sec) | Gas-expelling efficiency (%) | Peeling strength (N/cm) | Structural moduling ratio | Yield | Machine number |
|---|---|---|---|---|---|---|---|---|---|
| Micostructure | 10 | 0.8 | 0.9 | 200 | 89 | 90 | ⊙ | ⊙ | ⊙ |
| units: | 20 | 0.7 | 0.8 | 400 | 91 | 94 | ⊙ | ⊙ | ⊙ |
| tetragonal | 30 | 0.6 | 0.7 | 600 | 92 | 95 | ⊙ | ⊙ | ⊙ |
| cone | 36 | 0.5 | 0.6 | 720 | 99 | 109 | ⊙ | ⊙ | ⊙ |
| (n = 4) | 40 | 0.45 | 0.55 | 800 | 100 | 113 | ⊙ | ⊙ | ⊙ |
|  | 50 | 0.4 | 0.5 | 1000 | 100 | 114 | ⊙ | ⊙ | ⊙ |
|  | 60 | 0.3 | 0.4 | 1200 | 97 | 105 | ⊙ | ⊙ | ⊙ |
|  | 70 | 0.2 | 0.3 | 1400 | 90 | 92 | Δ | Δ | Δ |
|  | 80 | 0.1 | 0.2 | 1600 | 88 | 87 | Δ | Δ | Δ |

Note:
⊙: 90% and up;
○: 80~90%;
Δ: 70~80%;
X: 70% and down

TABLE 3

Testing and Analysis results for the optical microstructure film with pentagonal-cone microstructure units (n = 5)

| Specimen | Porosity (%) | H2/H1 | H3/(H1 − H2) | Gas-expelling rate(mm3/sec) | Gas-expelling efficiency (%) | Peeling strength (N/cm) | Structural moduling ratio | Yield | Machine number |
|---|---|---|---|---|---|---|---|---|---|
| Micostructure | 10 | 0.8 | 0.9 | 200 | 87 | 89 | ⊙ | ⊙ | ⊙ |
| units: | 20 | 0.7 | 0.8 | 400 | 91 | 90 | ⊙ | ⊙ | ⊙ |
| pentagonal | 30 | 0.6 | 0.7 | 600 | 94 | 95 | ⊙ | ⊙ | ⊙ |
| cone | 36 | 0.5 | 0.6 | 720 | 98 | 107 | ⊙ | ⊙ | ⊙ |
| (n = 5) | 40 | 0.45 | 0.55 | 800 | 99 | 108 | ⊙ | ⊙ | ⊙ |

TABLE 3-continued

Testing and Analysis results for the optical microstructure film with pentagonal-cone microstructure units (n = 5)

| Specimen | Porosity (%) | H2/H1 | H3/(H1 − H2) | Gas-expelling rate(mm3/sec) | Gas-expelling efficiency (%) | Peeling strength (N/cm) | Structural moduling ratio | Yield | Machine number |
|---|---|---|---|---|---|---|---|---|---|
| | 50 | 0.4 | 0.5 | 1000 | 100 | 112 | ◉ | ◉ | ◉ |
| | 60 | 0.3 | 0.4 | 1200 | 97 | 103 | ◉ | ◉ | ◉ |
| | 70 | 0.2 | 0.3 | 1400 | 92 | 94 | Δ | Δ | Δ |
| | 80 | 0.1 | 0.2 | 1600 | 90 | 90 | Δ | Δ | Δ |

Note:
◉: 90% and up;
○: 80~90%;
Δ: 70~80%;
X: 70% and down

Accordingly, the optical microstructure film of the present invention can be applied to packaging processes upon various objects. By providing the surface microstructure units 11, 11*a* and 11*b* to the film, the moisture inside the package can be greatly reduced. In the preferred embodiments described above on the solar cell modules, the introducing of the optical microstructure film with the microstructure units can provide excellent gas-expelling efficiency, ensure the yield, and thus lower the production cost.

In accordance with the present invention, the solar cell module including the optical microstructure film can be produced by the manufacturing method as described above.

While the present invention has been particularly shown and described with reference to a preferred embodiment, it will be understood by those skilled in the art that various changes in form and detail may be without departing from the spirit and scope of the present invention.

What is claimed is:

1. An optical microstructure film, made of a thermoplastic material, comprising:
   a base, having at least a surface; and
   a plurality of microstructure units, formed on the surface of the base in an array manner, each of the microstructure units further including a polygonal bottom to sit firmly on the surface of the base, each of the microstructure units also being formed as a polygonal cone having a top concave region, the polygonal cone having a removed tip for spherically centering the concave region, a radius R being defined as the radius of a pseudo sphere S having the surface of the concave region, a lower point of the microstructure unit being defined to the lowest point of the concave region, a distance between the lower point to the polygonal bottom being defined as a second height H2, a first height H1 being defined (H2) as a sum of the H2 and the R, a ratio of H2/H1 being ranged between 0.1 and 0.8; and
   wherein a volume Vp of said concave region is 0.05 to 0.4 of a volume of said pseudo sphere.

2. The optical microstructure film according to claim 1, wherein said microstructure unit is formed as a tetragonal cone having two first contact points and two second contact points, located to opposite sides of said concave region.

3. The optical microstructure film according to claim 1, wherein said microstructure unit is formed as a triangular cone having a first contact point, a second contact point and a third contact point, located separately to sides of said concave region.

4. The optical microstructure film according to claim 1, wherein said concave region is a curve polygonal surface.

5. The optical microstructure film according to claim 1, wherein said polygonal cone defines a length L for a lateral side thereof measured from said removal tip to the polygonal bottom, and a ratio of said radius R to the length L is ranged between 0.5 and 10.

6. An optical microstructure film, made of a thermoplastic material, comprising:
   a base, having at least a surface; and
   a plurality of microstructure units, formed on the surface of the base in an array manner, each of the microstructure units further including a polygonal bottom to sit firmly on the surface of the base, each of the microstructure units also being formed as a polygonal cone having a top concave region, the polygonal cone having a removed tip for spherically centering the concave region, a radius R being defined as the radius of a pseudo sphere S having the surface of the concave region, a lower point of the microstructure unit being defined to the lowest point of the concave region, a distance between the lower point to the polygonal bottom being defined as a second height H2, a first height H1 being defined (H2) as a sum of the H2 and the R, a ratio of H2/H1 being ranged between 0.1 and 0.8; and
   wherein said microstructure unit further includes a third height H3 being ranged 0.2 to 0.9 of the difference (H1-H2).

7. The optical microstructure film according to claim 6, wherein said microstructure unit is formed as a tetragonal cone having two first contact points and two second contact points, located to opposite sides of said concave region.

8. The optical microstructure film according to claim 6, wherein said microstructure unit is formed as a triangular cone having a first contact point, a second contact point and a third contact point, located separately to sides of said concave region.

9. The optical microstructure film according to claim 6, wherein said concave region is a curve polygonal surface.

10. An optical microstructure film, made of a thermoplastic material, comprising:
    a base, having at least a surface; and
    a plurality of microstructure units, formed on the surface of the base in an array manner, each of the microstructure units further including a polygonal bottom to sit firmly on the surface of the base, each of the microstructure units also being formed as a polygonal cone having a top concave region, the polygonal cone having a removed tip for spherically centering the concave region, a radius R being defined as the radius of a pseudo sphere S having the surface of the concave region, a lower point of the microstructure unit being defined to the lowest point of the concave region, a distance between the lower point to the polygonal bottom being defined as a second height H2, a first height H1 being defined (H2) as a sum of the H2 and the R, a ratio of H2/H1 being ranged between 0.1 and 0.8; and wherein a percentage of a volume Vp of said concave region to a volume Vt of said microstructure unit is defined as a porosity and is ranged between 36% and 80%.

11. The optical microstructure film according to claim 10, wherein said microstructure unit is formed as a tetragonal cone having two first contact points and two second contact points, located to opposite sides of said concave region.

12. The optical microstructure film according to claim 10, wherein said microstructure unit is formed as a triangular cone having a first contact point, a second contact point and a third contact point, located separately to sides of said concave region.

13. The optical microstructure film according to claim 10, wherein said concave region is a curve polygonal surface.

\* \* \* \* \*